(12) United States Patent
Xu et al.

(10) Patent No.: US 11,342,864 B2
(45) Date of Patent: May 24, 2022

(54) THREE-DEGREES-OF-FREEDOM ANGLE ADJUSTMENT DEVICE DRIVEN BY PIEZOELECTRIC CERAMICS AND ADJUSTING METHOD THEREOF

(71) Applicant: XI'AN JIAOTONG UNIVERSITY, Shaanxi (CN)

(72) Inventors: Minglong Xu, Shaanxi (CN); Zheng Tian, Shaanxi (CN); Zijian Jing, Shaanxi (CN)

(73) Assignee: XI'AN JIAOTONG UNTVERSTTY, Shaanxi (CN)

(\*) Notice: Subject to any disclaimer, the term of this patent is extended or adjusted under 35 U.S.C. 154(b) by 863 days.

(21) Appl. No.: 16/300,959

(22) PCT Filed: Apr. 25, 2017

(86) PCT No.: PCT/CN2017/081869
§ 371 (c)(1),
(2) Date: Nov. 13, 2018

(87) PCT Pub. No.: WO2017/198047
PCT Pub. Date: Nov. 23, 2017

(65) Prior Publication Data
US 2019/0157990 A1 May 23, 2019

(30) Foreign Application Priority Data
May 17, 2016 (CN) .......................... 201610326612.9

(51) Int. Cl.
*H02N 2/02* (2006.01)
*H01L 41/09* (2006.01)

(52) U.S. Cl.
CPC ......... *H02N 2/028* (2013.01); *H01L 41/0906* (2013.01); *H02N 2/02* (2013.01)

(58) Field of Classification Search
CPC ....... H02N 2/028; H02N 2/02; H01L 41/0906
See application file for complete search history.

(56) References Cited

U.S. PATENT DOCUMENTS

| 2009/0134319 A1* | 5/2009 | Sprague | G02B 26/085 |
| | | | 250/234 |
| 2017/0153186 A1* | 6/2017 | Jeanne | G01N 21/9501 |
| 2018/0246308 A1* | 8/2018 | Shi | G02B 21/0072 |
| 2019/0006144 A1* | 1/2019 | Kim | H02N 2/028 |

\* cited by examiner

*Primary Examiner* — Emily P Pham

(57) ABSTRACT

A three-degrees-of-freedom adjustment device driven by piezoelectric ceramics includes a Z-direction deflection mechanism at a bottom, an X-direction deflection mechanism mounted at the bottom, a Y-direction deflection mechanism mounted on the X-direction deflection mechanism, and a stage mounted on a deflect block of a deflection mechanism angle output; wherein the Z-direction deflection mechanism is located at the bottom, including a mounting substrate and two pre-compressed piezoelectric stacks; the piezoelectric stacks in the Z-direction deflection mechanism deflect in a Z direction under equal voltages; the X-direction deflection mechanism is similar to the Y-direction deflection mechanism in principle, including a deflection mechanism frame and a pair of piezoelectric stacks, wherein the X-direction deflection mechanism and the Y-direction deflection mechanism are vertically mounted, and are perpendicular to the Z-direction deflection mechanism plane as a whole.

3 Claims, 2 Drawing Sheets

THREE-DEGREES-OF-FREEDOM ANGLE ADJUSTMENT DEVICE DRIVEN BY PIEZOELECTRIC CERAMICS AND ADJUSTING METHOD THEREOF

CROSS REFERENCE OF RELATED APPLICATION

This is a U.S. National Stage under 35 U.S.C. 371 of the International Application PCT/CN2017/081869, filed Apr. 25, 2017, which claims priority under 35 U.S.C. 119(a-d) to CN 201610326612.9, filed May 17, 2016.

BACKGROUND OF THE PRESENT INVENTION

Field of Invention

The present invention relates to a technical field of precision instrument, and more particularly to a three-degrees-of-freedom angle adjustment device driven by piezoelectric ceramics and an adjusting method thereof.

Description of Related Arts

With the rapid development of aerospace engineering and other disciplines, high-precision attitude adjustment mechanisms have been widely used in target scanning detection, tracking, aiming and astronomical telescopes, image stabilization control, and precise pointing of spacecraft communications, and play an increasingly important role.

Electromagnetic actuators with a voice coil motor as the core device tend to have large volume, electromagnetic leakage during operation, and large power consumption and serious heat generation during maintaining the position.

Based on the conventional friction hinge connection method, there are low transmission precision, device wear, and device contamination caused by lubrication in order to reduce wear.

Piezoelectric actuators are widely used in high-precision adjustment and actuation mechanisms due to their small size, light weight, low power consumption, fast response, high actuation accuracy, large output force, and low heat generation.

Elastic deformation based on flexure hinge-based transmission structure has high transmission precision, no friction and no lubrication.

SUMMARY OF THE PRESENT INVENTION

In order to avoid defects of above-mentioned voice coil motor and friction hinge, an object of the present invention is to provide a three-degrees-of-freedom angle adjustment device driven by piezoelectric ceramics and an adjusting method thereof. The device of the present invention can deflect a driven object independently in X, Y and Z directions; and the device has the characteristics of small size, light weight, no mechanical friction, fast response, low angular power consumption, and independent adjustment of three degrees of freedom.

Accordingly, in order to accomplish the above object, the present invention provides:

a three-degrees-of-freedom angle adjustment device driven by piezoelectric ceramics, comprising: a Z-direction deflection mechanism (1), an X-direction deflection mechanism (2), a Y-direction deflection mechanism (3), and a stage (4), which are sequentially connected; the Z-direction deflection mechanism (1) is located in an XOY plane as a device mounting base, the X-direction deflection mechanism (2) is located in a YOZ plane, and the Y-direction deflection mechanism (3) is located in an XOZ plane;

wherein the Z-direction deflection mechanism (1) comprises a mounting substrate (1-1), a first pre-compressed piezoelectric stack actuator (1-2), a first Z-direction deflection beam (1-3), a second pre-compressed piezoelectric stack actuator (1-4), a Z-direction deflection block (1-5) and a second Z-direction deflection beam (1-6); the mounting substrate (1-1) is respectively connected to the first Z-direction deflection beam (1-3) and the second Z-direction deflection beam (1-6) by flexure hinges; the first Z-direction deflection beam (1-3) and the second Z-direction deflection beam (1-6) are connected to the Z-direction deflection block (1-5) through flexure hinges; two sides without the flexure hinges of the Z-direction deflection block (1-5) are mounting grooves; the first pre-compressed piezoelectric stack actuator (1-2) and the second pre-compressed piezoelectric stack actuator (1-4) are mounted in the mounting substrate (1-1) with one end embedded in the mounting substrate (1-1) and the other end respectively mounted through a flexure hinge in a groove where the second Z-direction deflection beam (1-6) and the first Z-direction deflection beam (1-3) are connected;

wherein the X-direction deflection mechanism (2) comprises a frame cut from a single piece of metal and two piezoelectric stacks, which has a base (2-1) formed by a large rigid axially symmetric metal frame having an upward concave shape; an internal groove of the base (2-1) is used for mounting with the Y-direction deflection mechanism (3), and two internal top ends of the base (2-1) are connected to a first X-direction deflection beam (2-3) and a second X-direction deflection beam (2-5) through external flexure hinges; internal sides of the first X-direction deflection beam (2-3) and the second X-direction deflection beam (2-5) are connected to an X-direction deflection block (2-4) through internal flexure hinges; the X-direction deflection block (2-4) is a metal block with a downward concave shaped for mounting with a Y-direction deflection block (3-4) in the Y-direction deflection mechanism (3); a bottom of the base (2-1) has two protruding metal blocks which form a recessed mounting groove (2-8), so as to mount with the mounting grooves of the Z-direction deflection block (1-5) on the Z-direction deflection mechanism (1); bottoms of the first X-direction deflection beam (2-3) and the second X-direction deflection beam (2-5), which are near the base (2-1), are respectively provided with a metal cap connected by a bottom flexure hinge, for mounting the piezoelectric stacks and guiding; lower ends of a first X-direction piezoelectric stack (2-2) and a second X-direction piezoelectric stack (2-6) are mounted on the base (2-1), and upper ends are respectively connected to the first X-direction deflection beam (2-3) and the second X-direction deflection beam (2-5) by the metal cap;

wherein the Y-direction deflection mechanism (3) comprises a frame cut from a single piece of metal and two piezoelectric stacks, which has a rigid base (3-1) with a bottom groove for positioning with a bottom groove of the X-direction deflection mechanism (2) by processing size constraints; two internal top ends of the rigid base (3-1) are connected to a first Y-direction deflection beam (3-3) and a second Y-direction deflection beam (3-5) through external flexure hinges; bottom ends of the first Y-direction deflection beam (3-3) and the second Y-direction deflection beam (3-5), which are near the rigid base (3-1), are connected to piezoelectric stack mounting caps by bottom flexure hinges;

internal sides of the first Y-direction deflection beam (3-3) and the second Y-direction deflection beam (3-5) are connected to the Y-direction deflection block (3-4) by internal flexure hinges; the Y-direction deflection block (3-4) is a metal block with a groove on a top surface, and the groove is used for mounting the X-direction deflection block (2-4); lower ends of a first Y-direction piezoelectric stack (3-2) and a second Y-direction piezoelectric stack (3-6) are mounted on the rigid base (3-1), and upper ends are respectively mounted on the piezoelectric stack mounting caps of the first Y-direction deflection beam (3-3) and the second Y-direction deflection beam (3-5);

wherein a top surface of the stage (4) is an object mounting plane, and a shape thereof is determined according to an object; a bottom of the stage (4) is an bidirectional groove, which is respectively connected to the X-direction deflection block (2-4) and the Y-direction deflection block (3-4); after mounting, the X-direction deflection block (2-4) and the Y-direction deflection block (3-4) are integrated.

Joint portions between the Z-direction deflection mechanism (1) and the direction deflection mechanism (2) are connected by a screw, and joint portions between the X-direction deflection mechanism (2) and the Y-direction deflection mechanism (3) are connected by a screw; the stage (4) is connected by a screw to a deflection block formed by mounting the X-direction deflection mechanism (2) and the Y-direction deflection mechanism (3). Mounting holes are drilled on the stage (4) for mounting objects.

An adjusting method of the three-degrees-of-freedom angle adjustment device driven by piezoelectric ceramics is also provided, comprising steps of:

for a Z-direction deflection mechanism (1), applying a pair of equal voltages to a first pre-compressed piezoelectric stack actuator (1-2) and a second pre-compressed piezoelectric stack actuator (1-4) mounted in the Z-direction deflection mechanism (1) for generating a pair of displacements with equal magnitudes and opposite directions based on an inverse piezoelectric effect of a piezoelectric material, wherein the first pre-compressed piezoelectric stack actuator (1-2) and the second pre-compressed piezoelectric stack actuator (1-4) respectively push a second Z-direction deflection beam (1-6) and a first Z-direction deflection beam (1-3) connected through flexure hinges to deflect in elongation directions, so as to deflect a Z-direction deflection block (1-5) located in a middle through flexure hinges; and the Z-direction deflection block (1-5) drives the entire adjustment device to deflect in a Z direction;

for an X-direction deflection mechanism (2), applying a pair of differential voltages to a first X-direction piezoelectric stack (2-2) and a second X-direction piezoelectric stack (2-6) mounted in the X-direction deflection mechanism (2) for generating a pair of differential displacement outputs based on the inverse piezoelectric effect, wherein the first X-direction piezoelectric stack (2-2) and the second X-direction piezoelectric stack (2-6) respectively push a first X-direction deflection beam (2-3) and a second X-direction deflection beam (2-5) connected through bottom flexure hinges to deflect around external flexure hinges; so as to deflect an X-direction deflection block (2-4) around an X axis through internal flexure hinges, thereby driving a stage (4) to deflect in an X-axis direction; and for a Y-direction deflection mechanism (3), applying a pair of differential voltages to a first Y-direction piezoelectric stack (3-2) and a second Y-direction piezoelectric stack (3-6) mounted in the Y-direction deflection mechanism (3) for generating a pair of differential displacement outputs based on the inverse piezoelectric effect, wherein the first Y-direction piezoelectric stack (3-2) and the second Y-direction piezoelectric stack (3-6) push a first Y-direction deflection beam (3-3) and a second Y-direction deflection beam (3-5) connected through bottom flexure hinges to deflect around internal flexure hinges, so as to deflect a Y-direction deflection block (3-4) around a Y axis through internal flexure hinges, thereby driving the stage (4) to deflect in a Y direction;

wherein deflections in the X, Y, and Z directions are independently driven, and Y outputs rarely affect each other, and a Z-direction output is independent; the entire adjustment device has no mechanical friction, and three-axis high-precision angle independent adjustment is achieved.

Compared with the prior art, the present invention has the following advantages:

1) Compact structure, small size and light weight.

2) Three-axis independent drive, no mechanical friction, high precision.

3) Large angular displacement output at full stroke, wherein if the angle output is small, lower driving voltage and lower power consumption can be realized, which increases the practicality of the device.

DETAILED DESCRIPTION OF THE PREFERRED EMBODIMENT

Figure 1:
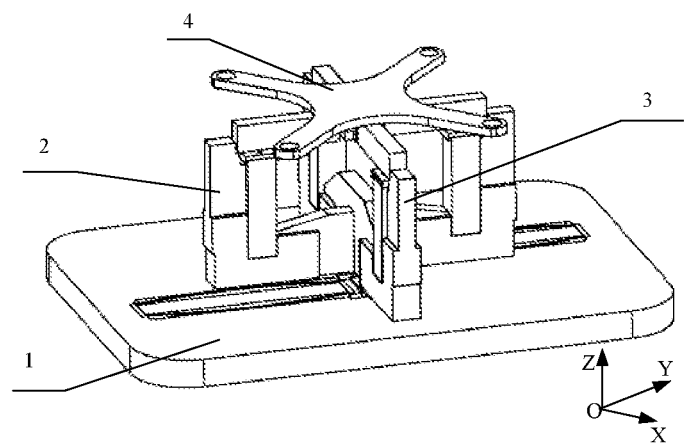
FIG. 1 is an assembly view of an adjustment device of the present invention.

The present invention provides a three-degrees-of-freedom angle adjustment device driven by piezoelectric ceramics, comprising: a Z-direction deflection mechanism 1, an X-direction deflection mechanism 2, a Y-direction deflection mechanism 3, and a stage 4. FIG. 1 is an assembly view of the present invention, wherein the X-direction deflection mechanism 2 and the Y-direction deflection mechanism 3 are vertically mounted, and are perpendicular to a plane of the Z-direction deflection mechanism 1 as a whole.

Figure 2:
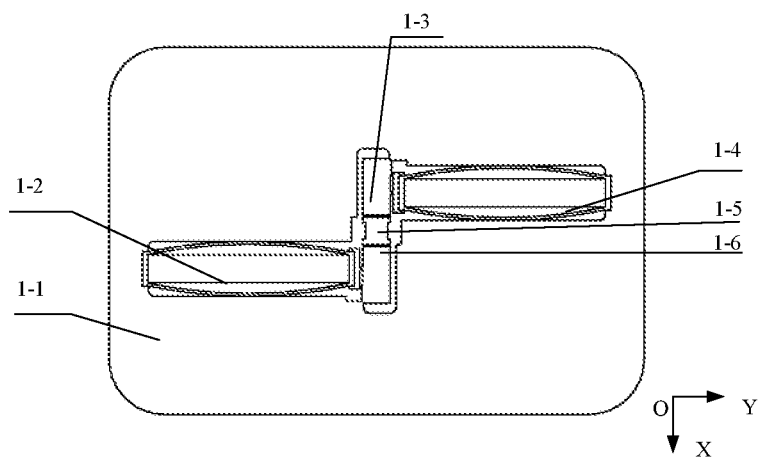
FIG. 2 illustrates a Z-direction deflection mechanism.

Referring to FIG. 2, the Z-direction deflection mechanism 1 comprises a mounting substrate 1-1, a first pre-compressed piezoelectric stack actuator 1-2, a first Z-direction deflection beam 1-3, a second pre-compressed piezoelectric stack actuator 1-4, a Z-direction deflection block 1-5 and a second Z-direction deflection beam 1-6; the mounting substrate 1-1 is respectively connected to the first Z-direction deflection beam 1-3 and the second Z-direction deflection beam 1-6 by flexure hinges; the first Z-direction deflection beam 1-3 and the second Z-direction deflection beam 1-6 are connected to the Z-direction deflection block 1-5 through flexure hinges; two sides without the flexure hinges of the Z-direction deflection block 1-5 are mounting grooves; the first pre-compressed piezoelectric stack actuator 1-2 and the second pre-compressed piezoelectric stack actuator 1-4 are mounted in the mounting substrate 1-1 with one end embedded in the mounting substrate 1-1 and the other end respectively mounted through a flexure hinge in a groove where the second Z-direction deflection beam 1-6 and the first Z-direction deflection beam 1-3 are connected.

Figure 3:
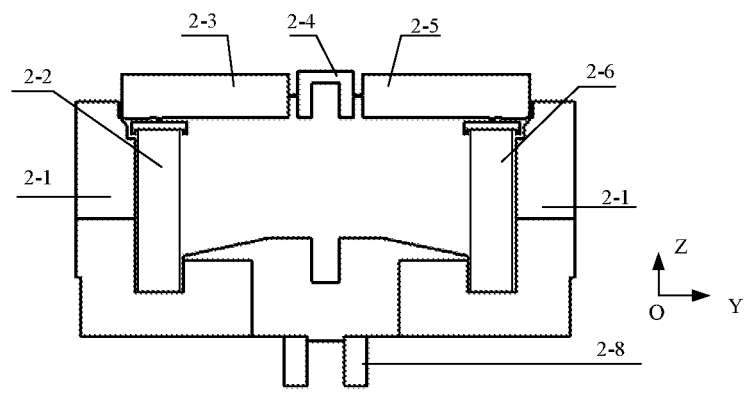
FIG. 3 illustrates an X-direction deflection mechanism.

Referring to FIG. 3, the X-direction deflection mechanism 2 comprises a frame cut from a single piece of metal and two piezoelectric stacks, which has a base 2-1 formed by a large rigid axially symmetric metal frame having an upward concave shape; an internal groove of the base 2-1 is used for mounting with the Y-direction deflection mechanism 3, and two internal top ends of the base 2-1 are connected to a first X-direction deflection beam 2-3 and a second X-direction deflection beam 2-5 through external flexure hinges; internal sides of the first X-direction deflection beam 2-3 and the second X-direction deflection beam 2-5 are connected to an X-direction deflection block 2-4 through internal flexure hinges; the X-direction deflection block 2-4 is a metal block with a downward concave shaped for mounting with a Y-direction deflection block 3-4 in the Y-direction deflection mechanism 3; a bottom of the base 2-1 has two protruding metal blocks which form a recessed mounting groove 2-8, so as to mount with the mounting grooves of the Z-direction deflection block 1-5 on the Z-direction deflection mechanism 1; bottoms of the first X-direction deflection beam 2-3 and the second X-direction deflection beam 2-5, which are near the base 2-1, are respectively provided with a metal cap connected by a bottom flexure hinge, for mounting the piezoelectric stacks and guiding; lower ends of a first X-direction piezoelectric stack 2-2 and a second X-direction piezoelectric stack 2-6 are mounted on the base 2-1, and upper ends are respectively connected to the first X-direction deflection beam 2-3 and the second X-direction deflection beam 2-5 by the metal cap.

Figure 4:
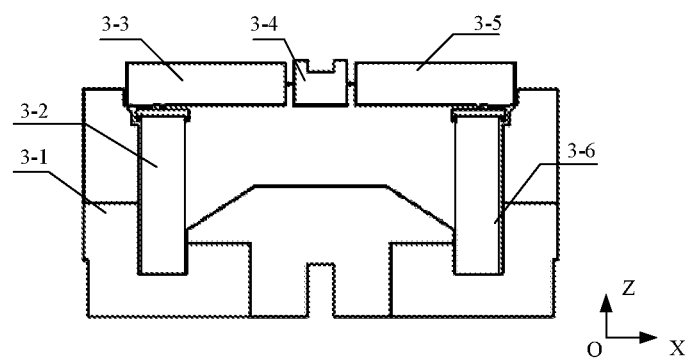
FIG. 4 illustrates a Y-direction deflection mechanism.

Referring to FIG. 4, the Y-direction deflection mechanism 3 is in an XOZ plane, and comprises a frame cut from a single piece of metal and two piezoelectric stacks, which has a rigid base 3-1 with a bottom groove for positioning with a bottom groove of the X-direction deflection mechanism 2 by processing size constraints; two internal top ends of the rigid base 3-1 are connected to a first Y-direction deflection beam 3-3 and a second Y-direction deflection beam 3-5 through external flexure hinges; bottom ends of the first Y-direction deflection beam 3-3 and the second Y-direction deflection beam 3-5, which are near the rigid base 3-1, are connected to piezoelectric stack mounting caps by bottom flexure hinges; internal sides of the first Y-direction deflection beam 3-3 and the second Y-direction deflection beam 3-5 are connected to the Y-direction deflection block 3-4 by internal flexure hinges; the Y-direction deflection block 3-4 is a metal block with a groove on a top surface, and the groove is used for mounting the X-direction deflection block 2-4; after mounting, the X-direction deflection block 2-4 and the Y-direction deflection block 3-4 are integrated; lower ends of a first Y-direction piezoelectric stack 3-2 and a second Y-direction piezoelectric stack 3-6 are mounted on the rigid base 3-1, and upper ends are respectively mounted on the piezoelectric stack mounting caps of the first Y-direction deflection beam 3-3 and the second Y-direction deflection beam 3-5;

A top surface of the stage 4 is an object mounting plane, and a shape thereof may be determined according to an object; a bottom of the stage 4 is an X-Y bidirectional groove, which is respectively connected to the X-direction deflection block 2-4 and the Y-direction deflection block 3-4.

In order to specify the location of each mechanism and installation relationships, a three-dimensional coordinate system is introduced. The Z-direction deflection mechanism 1 is located in a bottom XOY plane and is the mounting base of the device; the X-direction deflection mechanism 2 is located in a YOZ plane, whose bottom portion and is mounted in and positioned by the mounting groove of the Z-direction deflecting block 1-5 on the Z-direction deflecting mechanism 1 through the recessed mounting groove 2-8. The Y-direction deflection mechanism 3 is located in an XOZ plane, and the bottom of the Y-direction deflection mechanism 3 is positioned and matched with the bottom groove of the X-direction deflection mechanism 2 through the bottom groove; the X-direction deflection mechanism 2 and the Y-direction deflection mechanism 3 are vertically mounted, and positioning can be guaranteed by processing sizes. At the same time, the upward groove of the Y-direction deflection block 3-4 of the Y-direction deflection mechanism 3 cooperates with the downward groove of the X-direction deflection block 2-4 on the top of the X-direction deflection mechanism 2. After mounting, the X-direction deflection block 2-4 and the Y-direction deflection block 3-4 are integrated.

The bottom of the stage 4 is positioned and engaged with the integrated deflection block by a bidirectional groove. Joint portions between the Z-direction deflection mechanism 1 and the X-direction deflection mechanism 2 are connected by a screw, and joint portions between the X-direction deflection mechanism 2 and the Y-direction deflection mechanism 3 are connected by a screw; the stage 4 is connected by a screw to a 2-dimensional deflection block formed by mounting the X-direction deflection mechanism 2 and the Y-direction deflection mechanism 3. Mounting holes are drilled on the stage 4 for mounting objects.

An adjusting method of the three-degrees-of-freedom angle adjustment device driven by piezoelectric ceramics is also provided, comprising steps of:

for a Z-direction deflection mechanism 1, applying a pair of equal voltages to a first pre-compressed piezoelectric stack actuator 1-2 and a second pre-compressed piezoelectric stack actuator 1-4 mounted in the Z-direction deflection mechanism 1 for generating a pair of displacements with equal magnitudes and opposite directions based on an inverse piezoelectric effect of a piezoelectric material, wherein the first pre-compressed piezoelectric stack actuator 1-2 and the second pre-compressed piezoelectric stack actuator 1-4 respectively push a second Z-direction deflection beam 1-6 and a first Z-direction deflection beam 1-3 connected through flexure hinges to deflect in elongation directions, so as to deflect a Z-direction deflection block 1-5 located in a middle through flexure hinges; and the Z-direction deflection block 1-5 drives the entire adjustment device to deflect in a Z direction;

for an X-direction deflection mechanism 2, applying a pair of differential voltages to a first X-direction piezoelectric stack 2-2 and a second X-direction piezoelectric stack 2-6 mounted in the X-direction deflection mechanism 2 for generating a pair of differential displacement outputs based on the inverse piezoelectric effect, wherein the first X-direction piezoelectric stack 2-2 and the second X-direction piezoelectric stack 2-6 respectively push a first X-direction deflection beam 2-3 and a second X-direction deflection beam 2-5 connected through bottom flexure hinges to deflect around external flexure hinges; so as to deflect an X-direction deflection block 2-4 around an X axis through internal flexure hinges, thereby driving a stage 4 to deflect in an X-axis direction;

for a Y-direction deflection mechanism 3, applying a pair of differential voltages to a first Y-direction piezoelectric stack 3-2 and a second Y-direction piezoelectric stack 3-6 mounted in the Y-direction deflection mechanism 3 for generating a pair of differential displacement outputs based on the inverse piezoelectric effect, wherein the first Y-direction piezoelectric stack 3-2 and the second Y-direction piezoelectric stack 3-6 push a first Y-direction deflection beam 3-3 and a second Y-direction deflection beam 3-5 connected through bottom flexure hinges to deflect around internal flexure hinges, so as to deflect a Y-direction deflection block 3-4 around a Y axis through internal flexure hinges, thereby driving the stage 4 to deflect in a Y direction.

Figure 5:
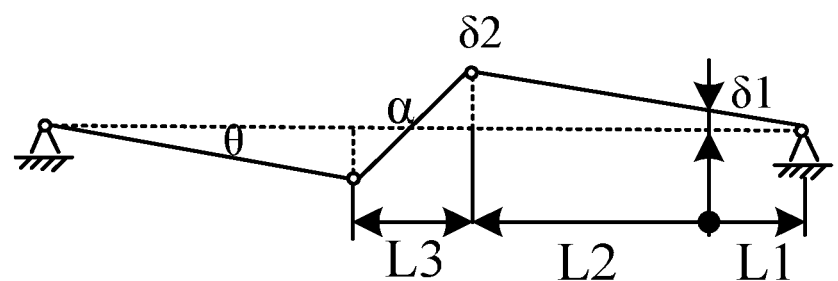
FIG. 5 is a sketch view of deflection of each axis.

The deflection principles of the Z-direction deflection mechanism 1, the X-direction deflection mechanism 2, and the Y-direction deflection mechanism 3 are identical. Referring to FIG. 5, L1 is the distance from the hinge center of the deflection beam piezoelectric stack to the center of the external flexure hinge, L2 is the distance between the internal side of the hinge center of the deflection beam and the hinge center oft the deflection block, and L3 is the section width of the deflection block in the plane of the corresponding deflection mechanism. If a displacement δ1 along a piezoelectric stack axis is generated by the piezoelectric stack, then the end of the deflection beam approximately produces a displacement δ2. Therefore, after being driven by the intermediate deflection block, a deflection angle α of the stage can be approximated as:

$$\alpha \approx \arctan\frac{\delta 1 * L2}{L1 * L3}$$

Deflections in the X, Y, and Z directions are independently driven, X and Y outputs rarely affect each other, and a Z-direction output is independent; the entire adjustment device has no mechanical friction, and three-axis high-precision angle independent adjustment can be achieved.

What is claimed is:

1. A three-degrees-of-freedom angle adjustment device driven by piezoelectric ceramics, comprising: a Z-direction deflection mechanism (1), an X-direction deflection mechanism (2), a Y-direction deflection mechanism (3), and a stage (4), which are sequentially connected; the Z-direction deflection mechanism (1) is located in an XOY plane as a device mounting base, the X-direction deflection mechanism (2) is located in a YOZ plane, and the Y-direction deflection mechanism (3) is located in an XOZ plane;

wherein the Z-direction deflection mechanism (1) comprises a mounting substrate (1-1), a first pre-compressed piezoelectric stack actuator (1-2), a first Z-direction deflection beam (1-3), a second pre-compressed piezoelectric stack actuator (1-4), a Z-direction deflection block (1-5) and a second Z-direction deflection beam (1-6); the mounting substrate (1-1) is respectively connected to the first Z-direction deflection beam (1-3) and the second Z-direction deflection beam (1-6) by first flexure hinges; the first Z-direction deflection beam (1-3) and the second Z-direction deflection beam (1-6) are connected to the Z-direction deflection block (1-5) through second flexure hinges; two sides without the flexure hinges of the Z-direction deflection block (1-5) are mounting grooves; the first pre-compressed piezoelectric stack actuator (1-2) and the second pre-compressed piezoelectric stack actuator (1-4) are mounted in the mounting substrate (1-1) with one end embedded in the mounting substrate (1-1) and the other end respectively mounted through a third flexure hinge in a groove where the second Z-direction deflection beam (1-6) and the first Z-direction deflection beam (1-3) are connected;

wherein the X-direction deflection mechanism (2) comprises a frame cut from a single piece of metal and two piezoelectric stacks, which has a base (2-1) formed by an axially symmetric metal frame having an upward concave shape; an internal groove of the base (2-1) is used for mounting with the Y-direction deflection mechanism (3), and two internal top ends of the base (2-1) are connected to a first X-direction deflection beam (2-3) and a second X-direction deflection beam (2-5) through first external flexure hinges; internal sides of the first X-direction deflection beam (2-3) and the second X-direction deflection beam (2-5) are connected to an X-direction deflection block (2-4) through first internal flexure hinges; the X-direction deflection block (2-4) is a metal block with a downward concave shaped for mounting with a Y-direction deflection block (3-4) in the Y-direction deflection mechanism (3); a bottom of the base (2-1) has two protruding metal blocks which form a recessed mounting groove (2-8), so as to mount with the mounting grooves of the Z-direction deflection block (1-5) on the Z-direction deflection mechanism (1); bottoms of the first X-direction deflection beam (2-3) and the second X-direction deflection beam (2-5), which are near the base (2-1), are respectively provided with a metal cap connected by a first bottom flexure hinge, for mounting the piezoelectric stacks and guiding; lower ends of a first X-direction piezoelectric stack (2-2) and a second X-direction piezoelectric stack (2-6) are mounted on the base (2-1), and upper ends are respectively connected to the first X-direction deflection beam (2-3) and the second X-direction deflection beam (2-5) by the metal cap;

wherein the Y-direction deflection mechanism (3) comprises a frame cut from a single piece of metal and two piezoelectric stacks, which has a rigid base (3-1) with a bottom groove for positioning with a bottom groove of the X-direction deflection mechanism (2); the Y-direction deflection mechanism (3) and the X-direction deflection mechanism (2) are vertically mounted, and are ensured to cooperate by processing sizes; two internal top ends of the rigid base (3-1) are connected to a first Y-direction deflection beam (3-3) and a second Y-direction deflection beam (3-5) through second external flexure hinges; ends of the first Y-direction deflection beam (3-3) and the second Y-direction deflection beam (3-5), which are near the rigid base (3-1), are connected to piezoelectric stack mounting caps by second bottom flexure hinges; internal sides of the first Y-direction deflection beam (3-3) and the second Y-direction deflection beam (3-5) are connected to the Y-direction deflection block (3-4) by second internal flexure hinges; the Y-direction deflection block (3-4) is a metal block with a groove on a top surface, and the groove is used for mounting the X-direction deflection block (2-4); lower ends of a first Y-direction piezoelectric stack (3-2) and a second Y-direction piezoelectric stack (3-6) are mounted on the rigid base (3-1), and upper ends are respectively mounted on the piezoelectric stack mounting caps of the first Y-direction deflection beam (3-3) and the second Y-direction deflection beam (3-5);

wherein a top surface of the stage (4) is an object mounting plane, and a shape thereof is determined according to an object; a bottom of the stage (4) is an X-Y bidirectional groove, which is respectively connected to the X-direction deflection block (2-4) and the Y-direction deflection block (3-4); after mounting, the X-direction deflection block (2-4) and the Y-direction deflection block (3-4) are integrated.

2. The three-degrees-of-freedom angle adjustment device, as recited in claim 1, wherein joint portions between the Z-direction deflection mechanism (1) and the X-direction deflection mechanism (2) are connected by a first screw, and joint portions between the X-direction deflection mechanism (2) and the Y-direction deflection mechanism (3) are connected by a second screw; the stage (4) is connected by a third screw to a deflection block formed by mounting the X-direction deflection mechanism (2) and the Y-direction deflection mechanism (3).

3. An adjusting method of the three-degrees-of-freedom angle adjustment device driven by piezoelectric ceramics as recited in claim 1, comprising steps of:

for a Z-direction deflection mechanism (1), applying a pair of equal voltages to a first pre-compressed piezoelectric stack actuator (1-2) and a second pre-compressed piezoelectric stack actuator (1-4) mounted in the Z-direction deflection mechanism (1) for generating a pair of displacements with equal magnitudes and opposite directions based on an inverse piezoelectric effect of a piezoelectric material, wherein the first pre-compressed piezoelectric stack actuator (1-2) and the second pre-compressed piezoelectric stack actuator (1-4) respectively push a second Z-direction deflection beam (1-6) and a first Z-direction deflection beam (1-3) connected through third flexure hinges to deflect in elongation directions, so as to deflect a Z-direction deflection block (1-5) located in a middle through fourth flexure hinges; and the Z-direction deflection block (1-5) drives the entire adjustment device to deflect in a Z direction;

for an X-direction deflection mechanism (2), applying a pair of differential voltages to a first X-direction piezoelectric stack (2-2) and a second X-direction piezoelectric stack (2-6) mounted in the X-direction deflection mechanism (2) for generating a pair of differential displacement outputs based on the inverse piezoelectric effect, wherein the first X-direction piezoelectric stack (2-2) and the second X-direction piezoelectric stack (2-6) respectively push a first X-direction deflection beam (2-3) and a second X-direction deflection beam (2-5) connected through third bottom flexure hinges to deflect around third external flexure hinges; so as to deflect an X-direction deflection block (2-4) around an X axis through third internal flexure hinges, thereby driving a stage (4) to deflect in an X-axis direction; and for a Y-direction deflection mechanism (3), applying a pair of differential voltages to a first Y-direction piezoelectric stack (3-2) and a second Y-direction piezoelectric stack (3-6) mounted in the Y-direction deflection mechanism (3) for generating a pair of differential displacement outputs based on the inverse piezoelectric effect, wherein the first Y-direction piezoelectric stack (3-2) and the second Y-direction piezoelectric stack (3-6) push a first Y-direction deflection beam (3-3) and a second Y-direction deflection beam (3-5) connected through fourth bottom flexure hinges to deflect around fourth internal flexure hinges, so as to deflect a Y-direction deflection block (3-4) around a Y axis through fourth internal flexure hinges, thereby driving the stage (4) to deflect in a Y direction;

wherein deflections in the X, Y, and Z directions are independently driven, X and Y outputs rarely affect each other, and a Z-direction output is independent; the entire adjustment device has no mechanical friction, and three-axis high-precision angle independent adjustment is achieved.

* * * * *